(12) United States Patent
Barz

(10) Patent No.: US 6,195,244 B1
(45) Date of Patent: Feb. 27, 2001

(54) ELECTRONIC CIRCUIT WITH A SCREENING CASE TO ATTENUATE HIGH-FREQUENCY INTERFERENCE

(75) Inventor: Herbert Barz, Flörsheim (DE)

(73) Assignee: Mannesmann VDO AG, Frankfurt (DE)

(*) Notice: Subject to any disclaimer, the term of this patent is extended or adjusted under 35 U.S.C. 154(b) by 0 days.

(21) Appl. No.: 09/319,085

(22) PCT Filed: Nov. 27, 1997

(86) PCT No.: PCT/EP97/06607

§ 371 Date: May 27, 1999

§ 102(e) Date: May 27, 1999

(87) PCT Pub. No.: WO98/25443

PCT Pub. Date: Jun. 11, 1998

(30) Foreign Application Priority Data

Dec. 2, 1996 (DE) .............................................. 196 49 848

(51) Int. Cl.[7] ...................................................... H05K 9/00
(52) U.S. Cl. ............................................ 361/111; 361/818
(58) Field of Search ................................... 361/816, 818, 361/111, 1

(56) References Cited

U.S. PATENT DOCUMENTS

| | | | |
|---|---|---|---|
| 4,754,101 | * | 6/1988 | Stickney et al. ..................... 361/818 |
| 4,831,498 | | 5/1989 | Baba . |
| 5,014,160 | | 5/1991 | McCoy, Jr. . |
| 5,160,807 | * | 11/1992 | Fry et al. ............................ 174/35 R |
| 5,297,007 | * | 3/1994 | Deyo et al. .......................... 361/707 |
| 5,428,508 | * | 6/1995 | Pronto ................................. 361/818 |
| 5,920,984 | * | 7/1999 | Persson et al. ........................ 29/836 |

FOREIGN PATENT DOCUMENTS

| | | |
|---|---|---|
| 2441209 | 3/1976 | (DE) . |
| 4291264 | 11/1992 | (DE) . |
| 4219932 | 5/1993 | (DE) . |
| 4317469 | 12/1994 | (DE) . |
| 4327766 | 2/1995 | (DE) . |
| 0313739 | 5/1989 | (EP) . |
| 0380740 | 8/1990 | (EP) . |
| 0729294 | 8/1996 | (EP) . |

\* cited by examiner

*Primary Examiner*—Michael J. Sherry
(74) *Attorney, Agent, or Firm*—Martin A. Farber

(57) ABSTRACT

In an electronic circuit, comprising electrical and electronic components and their connecting lines (3) on a printed circuit board (2), in which case a shielded housing encloses the electronic circuit, attenuating radiofrequencies, in order to prevent interference which acts on the electronic circuit and interference which is caused by the electronic circuit, in particular for use in a combination display instrument in a motor vehicle. Connecting lines (3) from the electronic circuit on the printed circuit board (2) are passed out of the shielded housing (1), connecting means (5) outside the shielded housing (1, 15) are connected to the connecting lines (3), and shielding is provided which reduce or suppress the ingress of radio-frequency interference into the shielded housing (1) and the emission of radio-frequency interference from the shielded housing (1).

18 Claims, 5 Drawing Sheets

ELECTRONIC CIRCUIT WITH A SCREENING CASE TO ATTENUATE HIGH-FREQUENCY INTERFERENCE

FIELD AND BACKGROUND OF THE INVENTION

The invention relates to an electronic circuit, comprising electrical and electronic components and their connecting lines on a printed circuit board, in which case a shielded housing encloses the electronic circuit, attenuating radiofrequencies, in order to prevent interference which acts on the electronic circuit and interference which is caused by the electronic circuit, in which case the circuit has connecting lines which lead out of the shielded housing to the exterior. This circuit is intended in particular for installation in a baseplate in a motor vehicle combination instrument, in which various display instruments, display areas, monitoring and warning lights as well as the electrical and electronic equipment parts required for this purpose are arranged in a common housing and are covered by a common transparent panel.

A shielding box is known from the prior art, in which the circuit is completely surrounded by a shielding housing, and contact means in the form of contact springs connect the circuit to a baseplate which contains all the other active and passive switching elements, conductor tracks, plug connectors and connecting points which are required for operation of the combination instrument. In this case, the circuit is accommodated on a printed circuit board and is connected to the baseplate via contact springs which have different shapes and pass through the shielding housing. A disadvantage with this type of shielding is that contact means having different shapes are required. Furthermore, the known shielding housing can be assembled only with difficulty, by hand.

SUMMARY OF THE INVENTION

The object of the invention is thus to provide an electronic circuit of the type mentioned initially which provides good shielding while being of simple design and being capable of being assembled easily.

With the circuit of the invention, it is advantageous that it is possible to dispense with a retaining frame for guiding the contact means and for preventing contact between the contact means and the shielded housing. Furthermore, this type of construction means that it is possible to achieve a grid size for the individual contact means with the normal value of ¹⁄₁₀ inch (corresponding to 2.54 mm) in a row.

It is particularly advantageous for the shielding means to be designed in such a manner that contact means are provided on the printed circuit board, which are electrically conductively connected to the shielded housing, and for the contact means to be connected to the connecting lines via capacitors inside the housing. In this case it is advantageous for the filter components, in particular capacitors, to be connected as close as possible to the housing wall, in order to keep the effective length of the unprotected connecting lines as short as possible. Furthermore, it is in this case advantageous that the filter capacitors represent an economic and effective shielding means.

By using pressure contacts, it is possible in an advantageous manner to dispense with a rigid connection. At the same time, this prevents the connection from becoming loose as a result of the printed circuit board and the shielded housing having different thermal expansion levels. Furthermore, the different thermal expansion levels of the printed circuit board and of the shielded housing result in friction between the components which make contact with one another, which overcomes any contamination that may be present. The pressure contact is designed, for example, in the form of a crown.

The configuration of the contact means as solder studs is simple to construct, while at the same time being very effective. Furthermore, it is advantageous in this context that the solder studs can be produced at the same time as the connections for the SMDs.

An electrically highly conductive connection between the individual contact means and a ground ring line prevents possible potential differences and enhances the radio-frequency shielding of the shielded housing overall.

The plated through holes for the ring lines at the same time act as a shielding grid. Where shielding must be provided for frequencies up to 1 GHz, it has been found to be advantageous for the distance between the individual contact point s to be about 12 mm.

Pushing the side parts of the shielded housing against the contact means results in an economic and effective pressure-contact connection between the shielded housing and the filter components.

The use of galvanized ferromagnetic sheeting for the shielded housing and solder studs composed of tin prevent contact oxidation of the conductor tracks, and thus ensures good electrical connection.

The fact that the printed circuit board has slots through which the lugs on the shielded housing are passed means that an electrical connection and mechanical joint can be produced in a simple way between the shielded housing case and the shielded housing cover by bending the lugs around, for example, the shielded housing cover. Furthermore, the bending of the lugs at the same time fixes the shielded housing on the printed circuit board in such a manner that the housing is permanently pressed against the contact means. The lugs also act as plated-through holes to the cover.

The use of aluminum-oxide ceramic for the printed circuit board ensures good heat dissipation for the components.

The multilayer technology allows complex circuits in a very small space.

Finally, if the capacitors are tuned to the interference frequency having the greatest amplitude on the respective lines, the interference is suppressed as well as possible.

If contact springs are used as the connecting means, it is possible to compensate for the different thermal expansion levels between the printed circuit board and the baseplate, without any mechanical stresses.

BRIEF DESCRIPTION OF THE DRAWINGS

The invention will be explained in the following text, for a particular, preferred exemplary embodiment, with reference to the drawings, in which.

DETAILED DESCRIPTION OF THE PREFERRED EMBODIMENT

Figure 1:
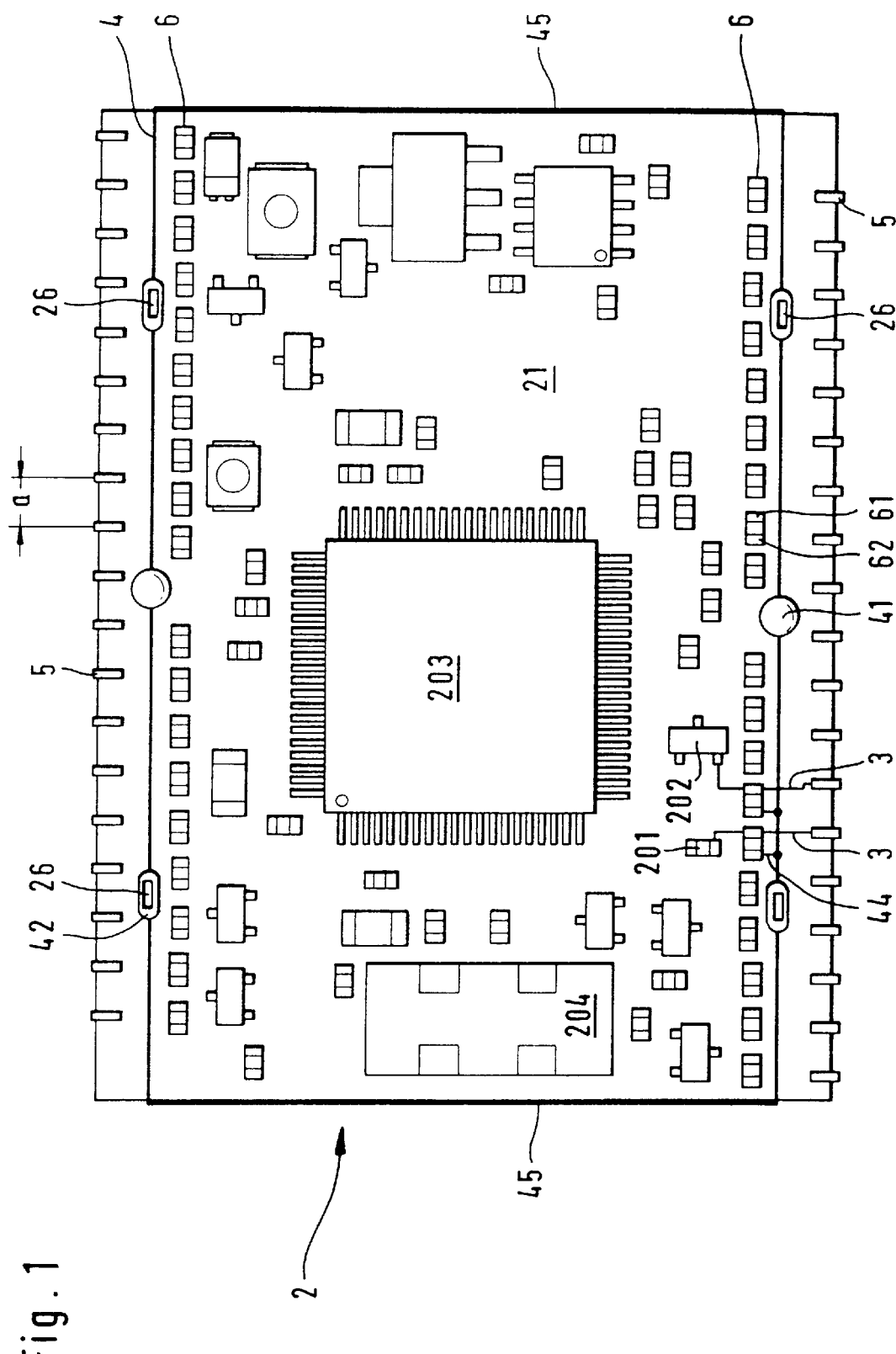
FIG. 1 shows a plan view of a particularly preferred printed circuit board according to the invention.

In FIG. 1, the printed circuit board 2 is composed of metal ceramic and has slots 26. There is a ground ring line 4 with solder studs 41, 42 on the top surface 21 of the printed circuit board 2. Along the longitudinal sides of the printed circuit board 2, capacitors 6 each having a connecting pin 62 are each connected via a ground connecting line 44 to the ground ring line 4. Connecting lines 3 connect in each case one contact spring 5 via in each case one connecting pin 61 of each capacitor 6 to the electronic circuit, comprising the microprocessor 203, an oscillator crystal 204, electronic components 201, 202 and the further other electronic parts shown, which are required for the microprocessor 203 to operate but are not provided with reference characters, in order to improve the clarity. In order to improve the clarity, only one connection between the electronic components 201, 202 and the respective contact springs 5 is shown in each case. The other contact springs 5 are also connected to the electronic circuit via connecting lines 3 which are not shown, in which case the connecting pins 61, 62 of each capacitor 6 in each case provide radio-frequency coupling from a connecting line 3, via a ground connecting line 44, to the ground ring line 4 and to the solder studs 41, 42. In the region where it crosses over the connecting lines 3, the ground ring line 4 is electrically insulated from these connecting lines 3. The circuit is designed in a manner known per se using multilayer technology. In the region of the narrow side of the printed circuit board 2, the ground ring line 4 is advantageously not only formed on the top surface 21 but also has a projection 45 beyond the edge of the upper surface 21, on the side surface of the printed circuit board 2.

The design according to the invention means that it is possible to achieve a grid size of a=2.54 mm with Size 0603 capacitors 6.

Figure 2:
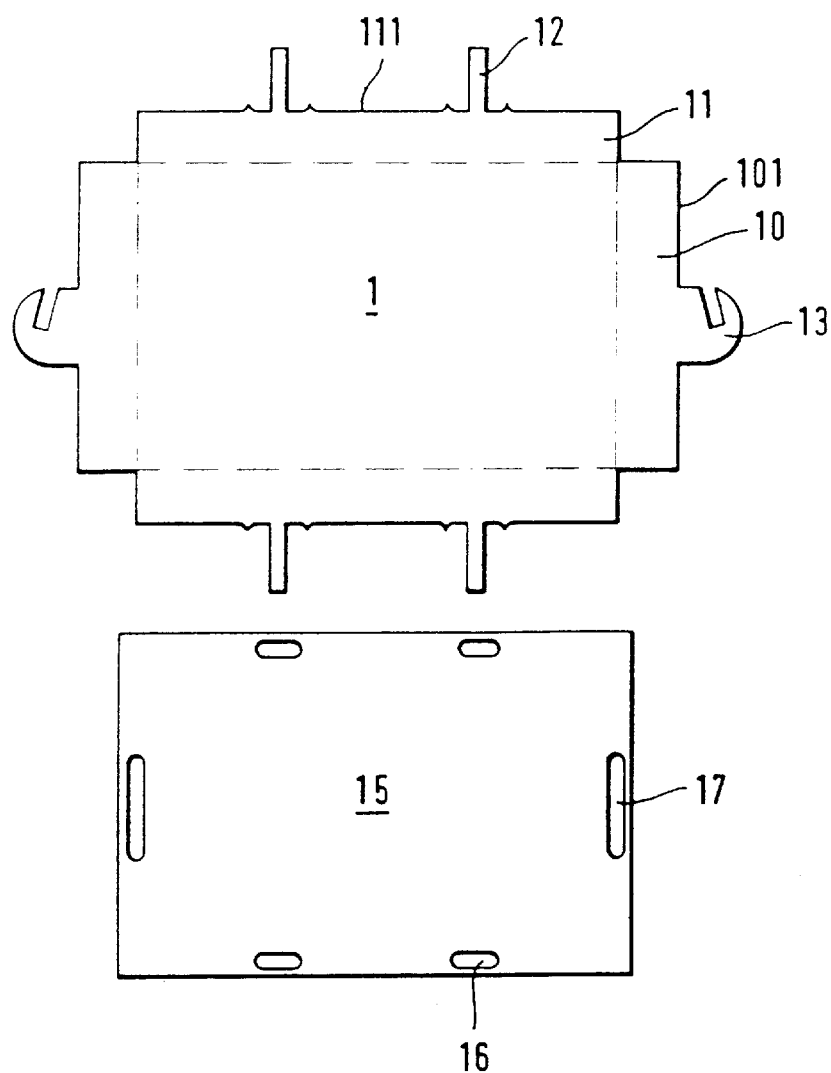
FIG. 2 shows the stamped shapes of a particularly preferred shielded housing according to the invention.

FIG. 2 shows the stamped parts of a particularly preferred shielded housing composed of galvanized tin plate, comprising a shielded housing case 1 and a shielded housing cover 15. The shielded housing case 1 has narrow sides 10 and longitudinal sides 11. The bottom edges 111 of the longitudinal sides 11 are extended by bending lugs 12. The bottom edges 101 of the narrow sides 10 are extended by interconnecting lugs 13. The shielded housing cover 15 has slots 16 for the bending lugs 12 to pass through, and slots 17 for the interconnecting lugs 13 to pass through. Before assembly, the longitudinal sides 11 and the narrow sides 10 are each bent through 90°, resulting in a case having four side walls and a base.

Figure 3:
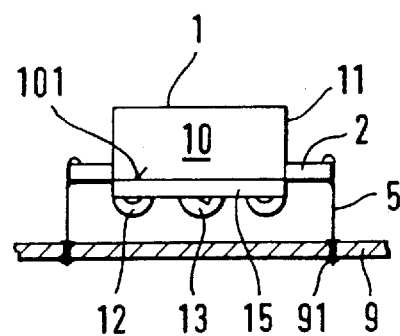
FIG. 3 shows the side view of the printed circuit board from FIG. 1 with the particularly preferred assembled shielded housing according to the invention, from FIG. 2, mounted on a baseplate.

FIG. 3 shows the view of the shielded housing from FIG. 2 mounted on the printed circuit board from FIG. 1, and mounted on a baseplate 9. The bending lugs 12 on the longitudinal sides 11 are pushed through the slots 26 in the printed circuit board 2 and through the slots 16 in the shielded housing cover 15, and are bent around so that they press against the shielded housing cover 15. The shielded housing cover 15 furthermore rests against the bottom edge 101 of the narrow side 10. At the same time, the interconnecting lugs 13 are pushed through the slot 17 in the shielded housing cover 15 and are interconnected. They thus also press the shielded housing cover 15 particularly permanently against the bottom edge 101 of the narrow side 10.

The shielded housing is advantageously assembled as follows: the shielded housing case 1 is located in such a manner that is open upward, and the bending lugs 12 and interconnecting lugs 13 project upward. The printed circuit board 2 is now fitted, with its top surface 21 downward, onto the shielded housing case in such a manner that the bending lugs 12 project through the slots 26. The shielded housing cover 15 is now fitted in such a manner that the bending lugs 12 project through the slots 16, and the interconnecting lugs 13 project through the slots 17. Finally, the bending lugs 12 are bent, and the interconnecting lugs 13 are interconnected.

The printed circuit board 2 is electrically connected and mechanically joined to the baseplate 9 by means of the contact springs 5, in the present case, for example, by means of wave-soldered joints 91.

Figure 4:
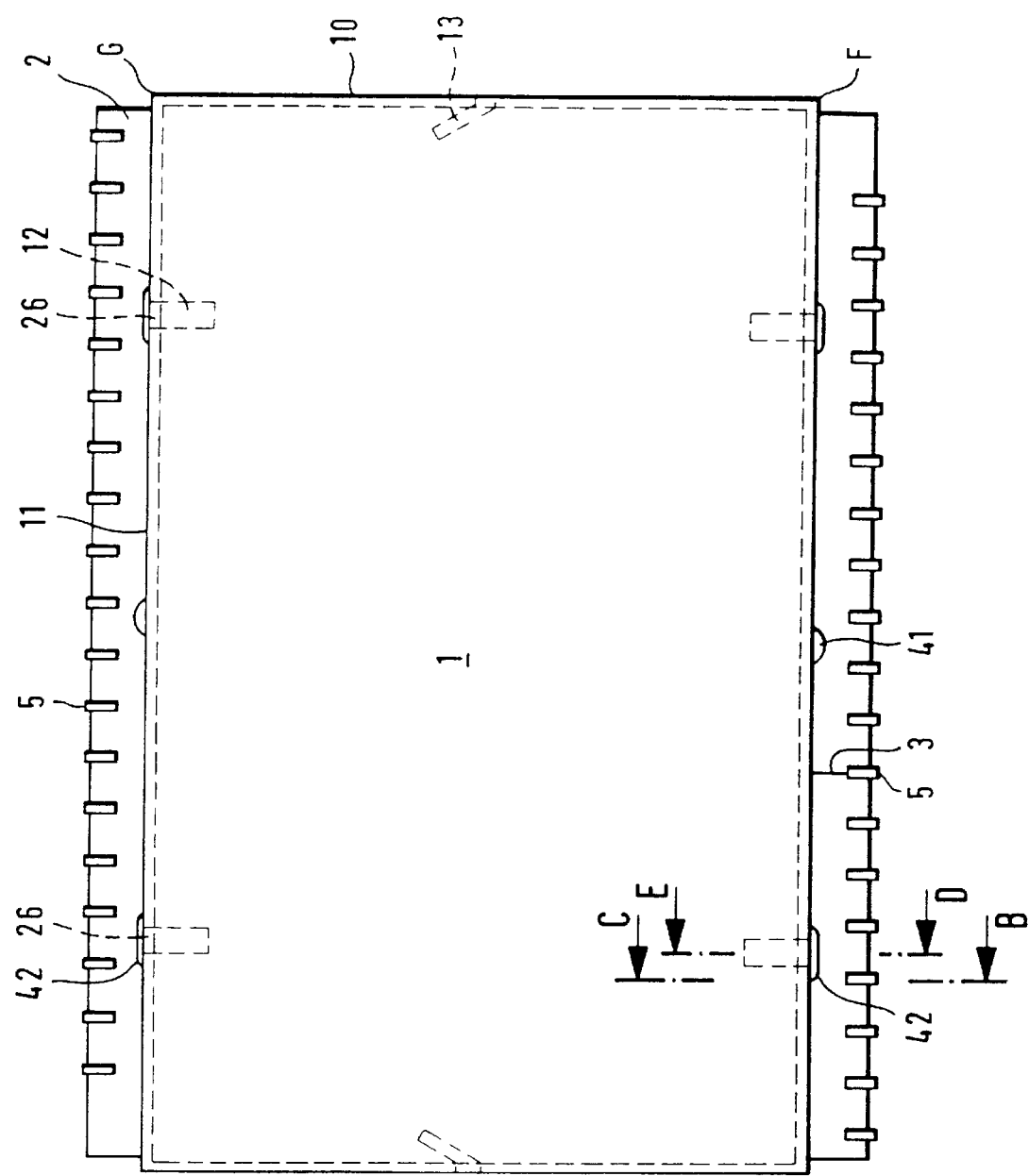
FIG. 4 shows a plan view of the printed circuit board from FIG. 1, with a plan view of the particularly preferred shielded housing according to the invention, from FIG. 2.

In FIG. 4, the shielded housing case 1 has been fitted onto the top surface 21 of the printed circuit board 2. The bottom edges 111 of the longitudinal sides 11 of the shielded housing case 1 are pressed against the solder studs 41, 42, and the shielded housing case 1 is thus electrically connected to the ground ring line 4. In the region between the points F and G, the narrow sides 10 of the shielded housing case 1 also cover the side edge of the printed circuit board 2 and the side of any multilayer region which may be present on the bottom surface 22 of the printed circuit board 2. The inside of the side surface 10 of the shielded housing case 1 is thus pressed against the projection 45, and is thus likewise electrically connected to the ground ring line 4.

Figure 5:
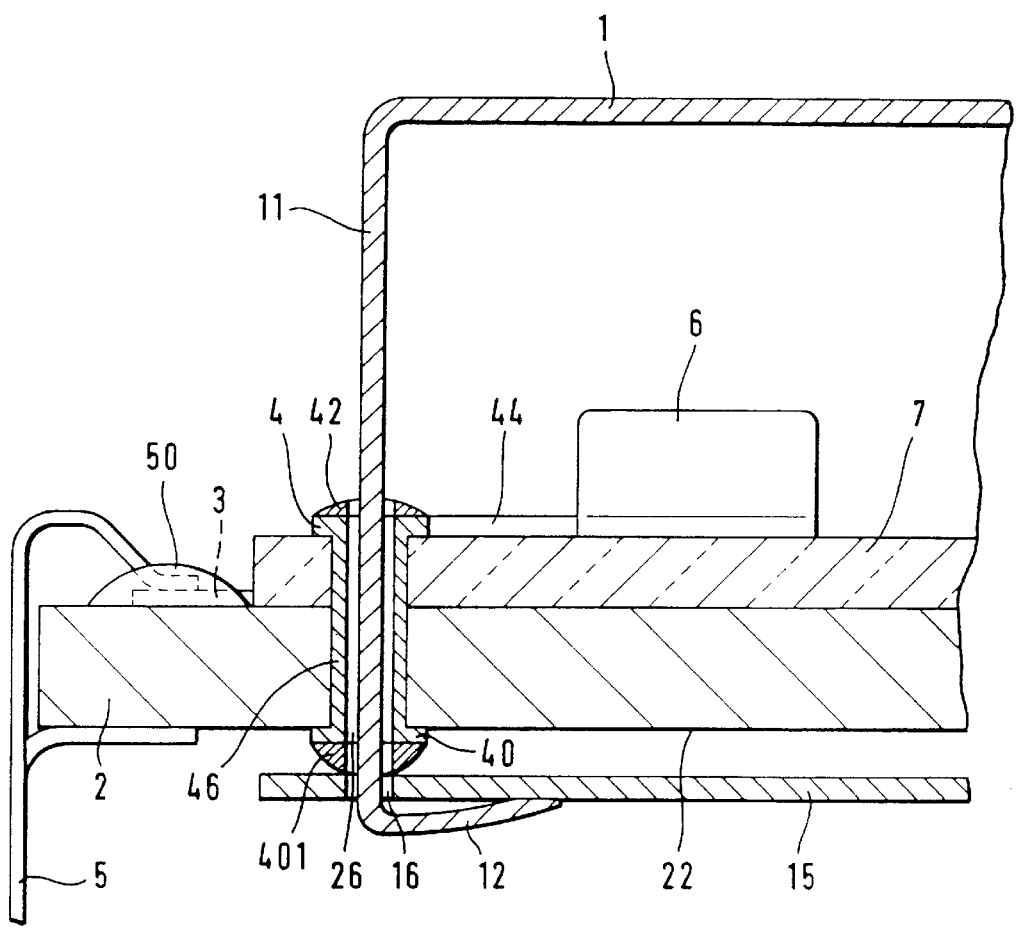
FIG. 5 shows the section D–E from FIG. 4, and, FIG. 6 shows the section B–C from FIG. 4.

FIG. 5 shows the section D–E from FIG. 3. The printed circuit board 2 has a further ground ring line 40 on its bottom surface. The bending lug 12 on the shielded housing case 1 is pushed through the slot 26 in the printed circuit board 2 and through the slot 16 in the shielded housing cover 15, and is thus bent against the shielded housing cover 15 such that the shielded housing cover 15 is pressed against the solder stud 401 which is located on the ground ring line 40. The ground ring lines 4, 40 are electrically conductively connected to one another by through-plating 46 that covers the edge of the slot 26. There are further plated-through holes (which are not illustrated), for example under the solder studs 41 (illustrated in FIG. 1). The ground connecting line 44 connects the capacitor 6 to the ground ring line 4. The contact spring 5 is electrically connected and mechanically joined to the connecting line 3 by means of the solder 50. In this section, the rest of the multilayer board is composed of glass 7. Other conductor tracks and multilayer boards may also be fitted on the bottom surface 22 of the printed circuit board 2. In this case, it is necessary to ensure that there are no inadvertent short circuits between the lines and the shielded housing cover 15.

Figure 6:
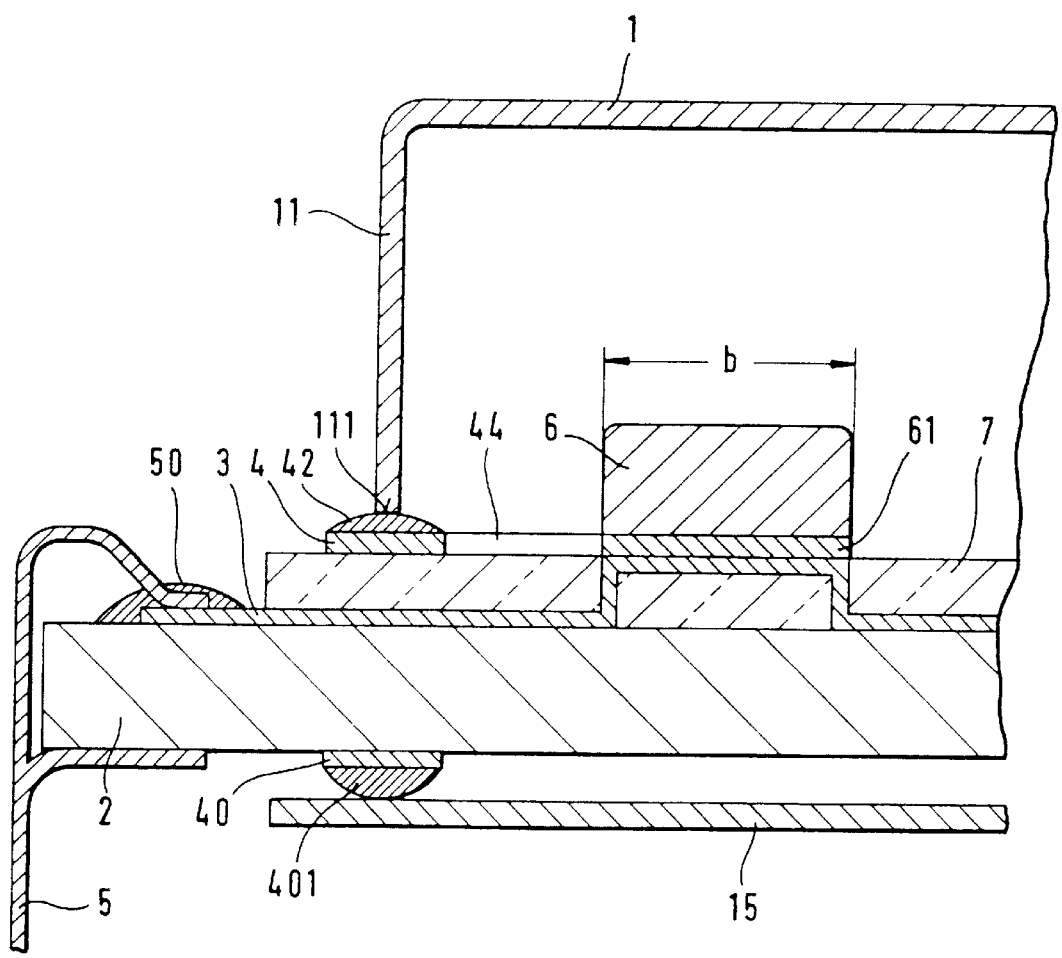

In FIG. 6, the bottom edge 111 of the longitudinal side 11 is pressed against the solder stud 42, and is thus electrically connected to the ground ring line 4. The connecting line 3 is passed through into the interior of the shielded housing, on the printed circuit board 2 and underneath the ground ring line 4. However, underneath the connecting pin 61 of the capacitor 6, the connecting line 3 changes its level in the multilayer board. In consequence, the radiofrequency which is to be short-circuited by the capacitor 6 is forced to pass via the connecting pin 61 of the capacitor 6, the capacitor 6, the connecting pin 62 of the capacitor 6 and the ground connection 44 to the ground ring line 4 and the shielded housing 1. If the connecting line 3 were routed with the conductor track in a straight line without bends underneath the connecting pin 61, it would be possible for a situation to arise in which the radiofrequency would not leave the connecting line 3.

In order to indicate possible orders of magnitude, it should be mentioned that, when using Size 0603 ceramic capacitors for the capacitors 6, the dimension b (the width of the capacitor) is about 0.75 mm. It can thus be seen that the effective length of the connecting line 3 which is not short-circuited for interference frequencies inside the shielded housing by a capacitor 6 is very short so that, in the example described above, interference frequencies up to 1 GHz on the connecting line 3 can be suppressed, to be precise both those which are produced by the microprocessor 203 inside the shielded housing and should not reach the exterior, as well as those which are coupled into the connecting lines 3 outside the housing and should not pass through into the interior of the shielded housing. The effective length of the connecting line 3 between the shielded housing and the capacitor 6 is so short that it cannot act as a transmitting antenna for interference frequencies attempting to pass from the exterior to the interior on the connecting line. It likewise cannot act as a receiving antenna for interference frequencies that are present inside the shielded housing. If the unprotected connecting line 3 were too long, the interference frequencies could otherwise leave the shielded housing via the connecting line 3.

The shielded housing described above and the electronic circuit protected by it have a compact design which, as a further advantage, means that the requirements for ceramic, conductor track and insulating material are small, while the baseplate 9 now virtually has to carry out only connecting functions, and can therefore be produced from simple, economic printed circuit board material.

What is claimed is:

1. An electronic circuit, comprising electrical and electronic components (201, 202, 203, 204) and their connecting lines on a printed circuit board (2), in which case a shielded housing encloses the electronic circuit, attenuating radiofrequencies, in order to prevent interference which acts on the electronic circuit and interference which is caused by the electronic circuit, in which case the circuit has connecting lines which lead out of the shielded housing to the exterior, in particular for use in a combination display instrument in a motor vehicle, wherein connecting lines (3) from the electronic circuit on the printed circuit board (2) are passed out of the shielded housing (1, 15), wherein connecting means (5) outside the shielded housing (1, 15) are connected to the connecting lines (3), and wherein shielding means are provided which reduce or suppress the ingress of radio-frequency interference into the shielded housing (1, 15) and the emission of radio-frequency interference from the shielded housing (1, 15).

2. The electronic circuit as claimed in claim 1, wherein the shielding means are such that there are contact means (41, 42, 401) on the printed circuit board (2), which are electrically conductively connected to the shielded housing (1, 15), and wherein capacitors (6) provide AC coupling between the connecting line (3) from the electronic circuit and the contact means (41, 42, 401) inside the shielded housing.

3. The electronic circuit as claimed in claim 2, wherein the connection between the contact means (41, 42, 401) and the shielded housing (1, 15) is in the form of pressure contacts.

4. The electronic circuit as claimed in claim 3, wherein the contact means are solder studs (41, 42, 401).

5. The electronic circuit as claimed in claim 2, wherein the contact means (41, 42, 401) are connected by means of one or more ground ring lines (4, 40).

6. The electronic circuit as claimed in claim 5, wherein the ground ring lines (4, 40) are electrically conductively connected to one another by means of plated-through holes (46).

7. The electronic circuit as claimed in claim 2, wherein longitudinal sides (11) of the shielded housing (1, 15) are pressed against the contact means (41, 42) and thus produce the electrical contact between the shielded housing and the contact means.

8. The electronic circuit as claimed in claim 1, wherein the shielded housing has a shielded housing case (1) and a shielded housing cover (15), in which case the shielded housing case (1) and the shielded housing cover (15) are respectively pressed against solder studs (41, 42, 401) on the top surface (21) and the bottom surface (22) of the printed circuit board (2).

9. The electronic circuit as claimed in claim 8, wherein the bottom edge (111) of the longitudinal side (11) of the shielded housing case (1) makes contact with the shielded housing cover (15).

10. The electronic circuit as claimed in claim 2, wherein the contact means are composed of tin, and the shielded housing (1, 15) is composed of galvanized ferromagnetic material.

11. The electronic circuit as claimed in claim 6, wherein the printed circuit board (2) has slots (26) through which bending lugs (12) on a shielded housing case are passed.

12. The electronic circuit as claimed in claim 1, wherein the printed circuit board (2) is composed of aluminum-oxide ceramic.

13. The electronic circuit as claimed in claim 12, wherein the circuit is designed using multilayer technology.

14. The electronic circuit as claimed in claim 2, wherein the capacitors (6) are respectively tuned to the interference frequency having the greatest amplitude on the respective connecting line (3).

15. The electronic circuit as claimed in claim 1, wherein the connecting means are in the form of contact springs (5).

16. The electronic circuit as claimed in claim 7, wherein the printed circuit board has slots through which bending lugs on a shielded housing case are passed.

17. The electronic circuit as claimed in claim 8, wherein the printed circuit board has slots through which bending lugs on the shielded housing case are passed.

18. The electronic circuit as claimed in claim 10, wherein the printed circuit board has slots through which bending lugs on a shielded housing case are passed.

* * * * *